United States Patent
Yoneda et al.

(10) Patent No.: US 8,019,462 B2
(45) Date of Patent: Sep. 13, 2011

(54) IMPRINT SYSTEM AND IMPRINT METHOD

(75) Inventors: Ikuo Yoneda, Yokohama (JP); Shinji Mikami, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/926,360

(22) Filed: Nov. 12, 2010

(65) Prior Publication Data
US 2011/0066273 A1    Mar. 17, 2011

Related U.S. Application Data

(62) Division of application No. 12/237,435, filed on Sep. 25, 2008, now Pat. No. 7,856,288.

(30) Foreign Application Priority Data

Oct. 2, 2007 (JP) .................................. 2007-258525

(51) Int. Cl.
*G06F 19/00* (2006.01)
*G05B 13/02* (2006.01)
*A01J 21/00* (2006.01)
*B27N 3/18* (2006.01)

(52) U.S. Cl. .......... 700/206; 700/51; 700/204; 977/887; 425/375; 264/319

(58) Field of Classification Search .............. 700/51, 700/108–110, 120, 121, 204, 206; 425/375; 264/319; 977/857–589, 887
See application file for complete search history.

(56) References Cited

U.S. PATENT DOCUMENTS

| 7,509,622 B2 * | 3/2009 | Sinha et al. .................. 716/50 |
| 2006/0196377 A1 | 9/2006 | Loopstra et al. |
| 2007/0228593 A1 | 10/2007 | Jones et al. |
| 2007/0278712 A1 | 12/2007 | Okushima et al. |
| 2008/0090170 A1 | 4/2008 | Yoneda |

FOREIGN PATENT DOCUMENTS

JP    2007-296783    11/2007

* cited by examiner

*Primary Examiner* — Sean P Shechtman
(74) *Attorney, Agent, or Firm* — Finnegan, Henderson, Farabow, Garrett & Dunner, L.L.P.

(57) ABSTRACT

An imprint system has a design data storing section which stores template information and remaining film thickness set value information, a vaporization-to-be-compensated storing section which stores a plurality of distributions of applied amounts for compensating vaporization, an arithmetic section which calculates a distribution of an applied amount for filling a pattern based upon the template information, calculates a distribution of an applied amount for forming a remaining film thickness based upon the remaining film thickness set value information, calculates a pattern density of the template from the template information, extracts a distribution of an applied amount for compensating vaporization, corresponding to this pattern density, from the vaporization-to-be-compensated storing section, and adds up this extracted distribution of an applied amount for compensating vaporization, the distribution of an applied amount for filling a pattern, and the distribution of an applied amount for forming a remaining film thickness, to calculate a distribution of an applied amount of the imprint member, and an application section which applies the imprint member on the substrate based upon the distribution of an applied amount of the imprint member.

5 Claims, 10 Drawing Sheets

DISTRIBUTION OF
APPLIED AMOUNT
OF IMPRINT MEMBER

DISTRIBUTION OF APPLIED AMOUNT OF IMPRINT MEMBER (a) (b)

IMPRINT SYSTEM AND IMPRINT METHOD

This is a division of application Ser. No. 12/237,435, filed Sep. 25, 2008 now U.S. Pat. No. 7,856,288, which is incorporated herein by reference.

CROSS REFERENCE TO RELATED APPLICATIONS

This application is based upon and claims benefit of priority from the prior Japanese Patent Application No. 2007-258525, filed on Oct. 2, 2007, the entire contents of which are incorporated herein by reference.

BACKGROUND OF THE INVENTION

1. Field of the Invention

The present invention relates to an imprint system and an imprint method.

2. Related Art

With semiconductor integrated circuits made finer and more highly integrated, a photolithography device as a pattern transfer technique for realizing microprocessing has been required to have higher, precision, which has led to the drawback of increasing device cost.

As opposed to this, as a technique for conducting formation of a fine pattern at a low cost, an optical nano-imprint method has been proposed. This is a method where a stamper (template) having the same concave and convex as a pattern wished to be formed on a substrate is pressed to a photocurable organic material layer formed on the substrate surface where transfer is to be made, the organic material layer is irradiated with a light to be cured, and the template is separated from the organic material layer (mold-releasing), to transfer a resist pattern.

An imprint member (photocurable organic material) is applied by an inkjet method. Since the imprint member vaporizes, an applied amount of the imprint member is obtained from a total of an applied amount for filling a pattern of the template, an applied amount for forming a remaining film thickness, and an applied amount for compensating a vaporization amount. This vaporization amount is not uniform on the substrate, but is distributed variously in accordance with a device characteristic.

In the conventional imprint device used has been one kind of distribution of application of the imprint member for compensating the vaporization amount in accordance with the device.

However, the vaporization amount varies depending upon a pattern density of a template used. Therefore, an applied amount of the imprint member for compensating the vaporization amount may differ from an actual vaporization amount, depending upon the pattern density of the template, thereby causing a decreased precision in shape of a pattern to be transferred. When a process treatment such as etching is performed using the pattern as thus described, a problem of generation of the abnormality in processed shape, or the like, occurs.

SUMMARY OF THE INVENTION

According to one aspect of the present invention, there is provided an imprint system, comprising:

a design data storing section which stores template information including a position and a depth of a concave-convex pattern of a template, and remaining film thickness set value information including a film thickness of a remaining film uniformly formed on a substrate;

a vaporization-to-be-compensated storing section which stores a plurality of distributions of applied amounts for compensating vaporization, each showing an applied position and an applied amount of an imprint member that compensates the imprint member to vaporize in accordance with pattern densities of said template;

an arithmetic section which calculates a distribution of an applied amount for filling a pattern, showing an applied position and an applied amount of the imprint member corresponding to the imprint member to fill the inside of said concave-convex pattern based upon said template information, calculates a distribution of an applied amount for forming a remaining film thickness, showing an applied position and an applied amount of the imprint member corresponding to the imprint member to form the remaining film based upon said remaining film thickness set value information, calculates a pattern density of the template from said template information, extracts a distribution of an applied amount for compensating vaporization, corresponding to this pattern density, from said vaporization-to-be-compensated storing section, and adds up this extracted distribution of an applied amount for compensating vaporization, said distribution of an applied amount for filling a pattern, and said distribution of an applied amount for forming a remaining film thickness, to calculate a distribution of an applied amount of the imprint member; and an application section which applies the imprint member on the substrate based upon said distribution of an applied amount of the imprint member.

According to one aspect of the present invention, there is provided an imprint system, comprising:

a first design data storing section which stores template information including a position and a depth of a concave-convex pattern of a template;

a vaporization-to-be-compensated storing section which stores a plurality of distributions of applied amounts for compensating vaporization, each showing an applied position and an applied amount of an imprint member that compensates the imprint member to vaporize, in accordance with pattern densities of said template;

a first arithmetic section which calculates a pattern density of the template from said template information, extracts a distribution of an applied amount for compensating vaporization, corresponding to this pattern density, from said vaporization-to-be-compensated storing section, calculates a dummy template pattern such that this extracted distribution of an applied amount for compensating vaporization becomes a distribution of an applied amount for filling a pattern, showing an applied position and an applied amount of the imprint member corresponding to the imprint member to fill the concave-convex pattern, and synthesizes this dummy template pattern with the concave-convex pattern of said template, to create a synthesized pattern;

a second design data storing section which stores synthesized pattern information including said synthesized pattern, and remaining film thickness set value information including a film thickness of a remaining film uniformly formed on a substrate;

a second arithmetic section which calculates a distribution of an applied amount for filling a synthesized pattern, showing an applied position and an applied amount of the imprint member corresponding to the imprint member to fill the inside of a concave-convex pattern of said synthesized pattern based upon said synthesized pattern information, calculates a distribution of an applied amount for forming a remaining film thickness, showing an applied position and an applied amount of the imprint member corresponding to the imprint member to form the remaining film based upon said remaining film thickness set value information, and adds up said distribution of an applied amount for filling a synthesized pattern and said distribution of an applied amount for forming a remaining film thickness, to calculate a distribution of an applied amount of the imprint member; and an application section which applies the imprint member on the substrate based upon said distribution of an applied amount of the imprint member.

According to one aspect of the present invention, there is provided an imprint method, comprising:

calculating a distribution of an applied amount for filling a pattern, showing an applied position and an applied amount of an imprint member corresponding to the imprint member to fill the inside of a concave-convex pattern of a template based upon template information including a position and a depth of said concave-convex pattern;

calculating a distribution of an applied amount for forming a remaining film thickness, showing an applied position and an applied amount of the imprint member corresponding to the imprint member to form a remaining film that is uniformly formed on a substrate based upon remaining film thickness set value information including a film thickness of the remaining film;

calculating a pattern density of said template based upon said template information;

adding up a distribution of an applied amount for compensating vaporization, showing an applied position and an applied amount of the imprint member that compensates the imprint member to vaporize in accordance with said calculated pattern density, said distribution of an applied amount for filling a pattern, and said distribution of an applied amount for forming a remaining film thickness, to calculate a distribution of an applied amount of the imprint member; and applying the imprint member on the substrate based upon said distribution of an applied amount of the imprint member.

According to one aspect of the present invention, there is provided an imprint method, comprising:

calculating a pattern density of a template from template information including a position and a depth of a concave-convex pattern of said template;

calculating a dummy template pattern such that a distribution of an applied amount for compensating vaporization, showing an applied position and an applied amount of an imprint member that compensates the imprint member to vaporize in accordance with said calculated pattern density becomes a distribution of an applied amount for filling a pattern, showing an applied position and an applied amount of the imprint member corresponding to the imprint member to fill the concave-convex pattern;

synthesizing said dummy template pattern with the concave-convex pattern of said template, to create a synthesized pattern;

calculating a distribution of an applied amount for filling a synthesized pattern, showing an applied position and an applied amount of the imprint member corresponding to the imprint member to fill the inside of a concave-convex pattern of said synthesized pattern;

calculating a distribution of an applied amount for forming a remaining film thickness, showing an applied position and an applied amount of the imprint member corresponding to the imprint member to form a remaining film that is uniformly formed on a substrate based upon remaining film thickness set value information including a film thickness of the remaining film;

adding up said distribution of an applied amount for filling a synthesized pattern and said distribution of an applied amount for forming a remaining film thickness, to calculate a distribution of an applied amount of the imprint member; and applying the imprint member on the substrate based upon said distribution of an applied amount of the imprint member.

DESCRIPTION OF THE EMBODIMENTS

In the following, an embodiment of the present invention is described with reference to drawings.

Figure 1:
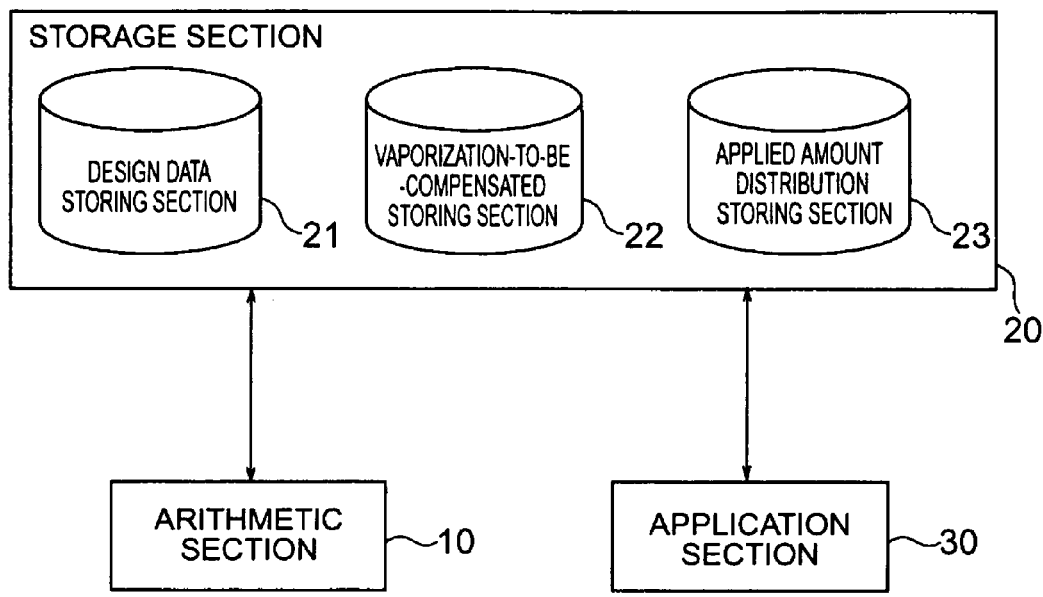
FIG. 1 is a view showing a schematic configuration of an imprint system according to an embodiment of the present invention.

FIG. 1 shows a schematic configuration of an imprint system according to the embodiment of the present invention. The imprint system has an arithmetic section 10, a storage section 20, and an application section 30. The storage section 20 has a design data storing section 21, a vaporization-to-be-compensated storing section 22, and an applied amount distribution storing section 23.

The design data storing section 21 stores remaining film thickness set value information and template information. The template information is pattern data (GDS, etc.) at the time of producing a template, and includes a depth, a position, and the like, of a concave-convex pattern formed on the template.

The vaporization-to-be-compensated storing section 22 has a plurality of distributions of applied amounts for compensating vaporization in accordance with pattern densities of the template. An imprint member applied on a substrate vaporizes, and the distribution of an applied amount for compensating vaporization shows an applied position and an applied amount of the imprint member that compensate the imprint member to vaporize. Here, it is possible to previously measure a vaporization amount of the imprint member, so as to experimentally obtain a distribution of an applied amount for compensating vaporization in accordance with the pattern density of the template.

The arithmetic section 10 calculates a pattern density based upon the template information stored in the design data storing section 21, and extracts a corresponding distribution of an applied amount for compensating vaporization from the vaporization-to-be-compensated storing section 22. Further, the arithmetic section 10 calculates a distribution of an applied amount for filling a pattern based upon the template information.

Moreover, the arithmetic section 10 calculates a distribution of an applied amount for forming a remaining film thickness based upon the remaining film thickness set value information. The distribution of an applied amount for filling a pattern and the distribution of an applied amount for forming a remaining film thickness are described later.

The distribution of an applied amount for compensating vaporization, the distribution of an applied amount for filling a pattern, and the distribution of an applied amount for forming a remaining film thickness are then added up, to calculate a distribution of an applied amount of the imprint member, and the calculated distribution is stored into the applied amount distribution storing section 23.

The application section 30 applies the imprint member on the substrate based upon the distribution of an applied amount of the imprint member stored into the applied amount distribution storing section 23.

Figure 2:
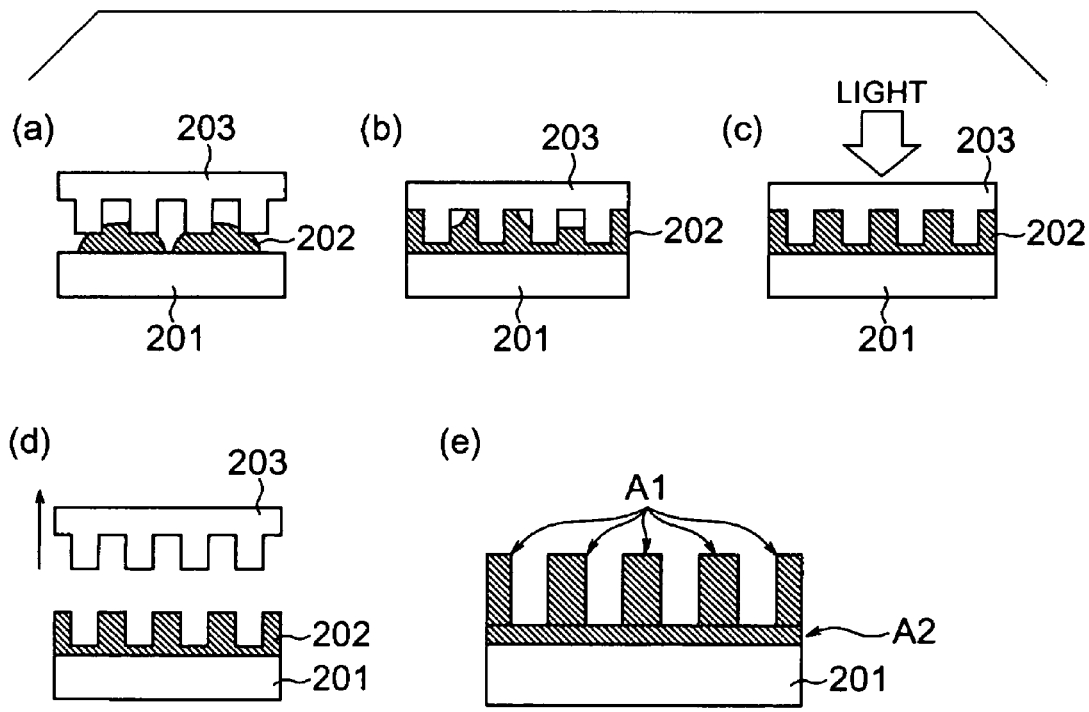
FIG. 2 is a process sectional view showing an imprint method according to the same embodiment.

A process after the application of the imprint member on the substrate is described using FIG. 2.

As shown in FIG. 2(*a*), a template 203 having the same concave and convex as a pattern wished to be formed is brought into contact with a liquid photocurable organic material (imprint member) 202 applied on the substrate 201. The imprint member 202 is, for example, an acrylic monomer.

As shown in FIG. 2(*b*), the liquid imprint member 202 flows into the concave-convex pattern of the template 203.

As shown in FIG. 2(*c*), after filling of the imprint member 202 into the concave-convex pattern, the imprint member 202 is irradiated with a light, to be cured. The irradiated light may be any light so long as being capable of curing the imprint member 202, and for example, a lamp light is usable. The template 203 is formed of a material that transmits this light, e.g. silica glass.

As shown in FIG. 2(*d*), the template 203 is separated from the imprint member 202. In this state, the imprint member 202 has already been cured, and hence is held in the same state (shape) as at the time of the template 203 coming into contact therewith.

Such a process is repeated to form a plurality of imprint members having a desired concave-convex pattern on the substrate.

Subsequently, a film to be processed (not shown) on the substrate is etched using the pattern, formed by the template 203, as a mask. Processes such as burying of a wiring material into a pattern groove formed by etching, CMP, and the like are performed, to form an element.

Among the foregoing distributions of applied amounts of the imprint member, the applied amount for filling a pattern corresponds to a region A1 shown in FIG. 2(*e*), and the applied amount for forming a remaining film thickness corresponds to a region A2. Namely, the applied amount for filling a pattern is an applied amount for filling the inside of a concave-convex pattern of the template, and the applied amount for forming a remaining resin is an applied amount for forming a film (remaining film) that is uniformly formed on a substrate 201.

Therefore, the distribution of an applied amount for filling a pattern shows an applied position and an applied amount of the imprint member corresponding to the imprint member to fill the inside of a concave-convex pattern of a template. Further, the distribution of an applied amount for forming a remaining film thickness shows an applied position and an applied amount of the imprint member corresponding to the imprint member to form a remaining film.

Figure 3:
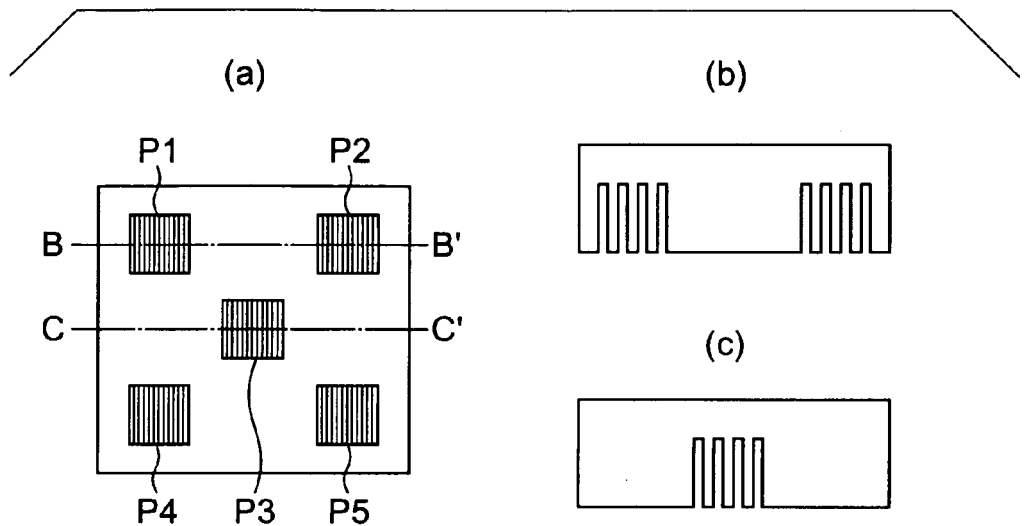
FIG. 3 is a view showing a schematic configuration of a template.

Next, a method for calculating the distribution of an applied amount of the imprint member is described. First, the case of using a template T1 as shown in FIG. 3 is described. FIG. 3(*a*) shows a bottom view of the template T1 in a state where a concave-convex pattern is turned downward. Concave-convex patterns P1 to P5 are formed in four corners and the center within the template T1, and a concave-convex pattern is not formed in a region other than those patterns. FIG. 3(*b*) is a vertical sectional view of the template T1 along a line B-B' of FIG. 3(*a*), and FIG. 3(*c*) is a vertical sectional view of the template T1 along a line C-C' of FIG. 3(*a*).

Figure 4:
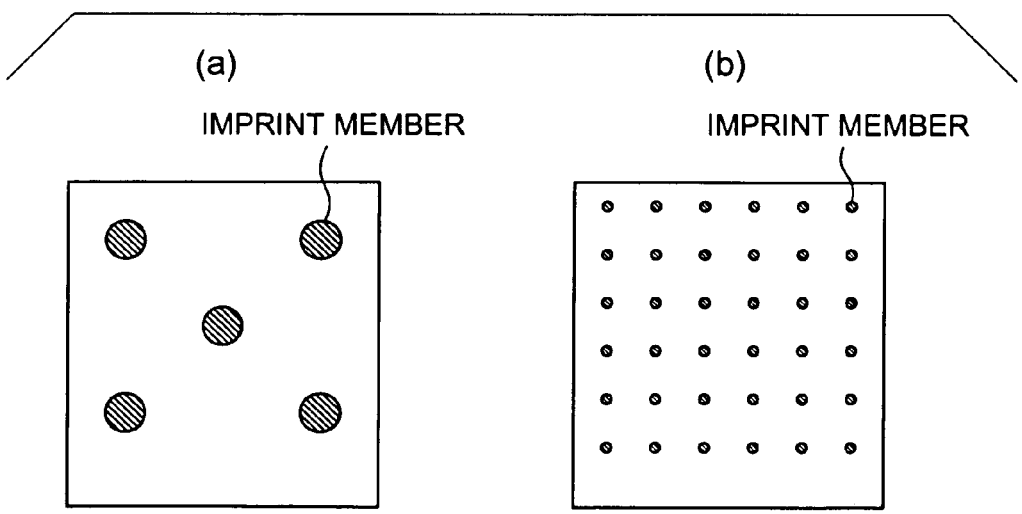
FIG. 4 is a view showing a distribution of an applied amount for filling a pattern and a distribution of an applied amount for forming a remaining film thickness.

A distribution of an applied amount for filling a pattern on a substrate where the patterns are formed by the template T1 as thus described is a distribution as shown in FIG. 4(*a*). Namely, the imprint member in amount to fill the concave-convex patterns P1 to P5 of the template T1 is applied on the regions corresponding to those concave-convex patterns. This distribution of an applied amount for filling a pattern is calculated by the arithmetic section 10 based upon positions, depths, and the like of the concave-convex patterns which are included in the template information stored in the design data storing section 21.

FIG. 4(*b*) shows a distribution of an applied amount for forming a remaining film thickness. The imprint member to form a remaining film is uniformly applied on the substrate. This distribution of an applied amount for forming a remaining film thickness is calculated by the arithmetic section 10 based upon the remaining film thickness set value information stored in the design data storing section 21.

Figure 5:
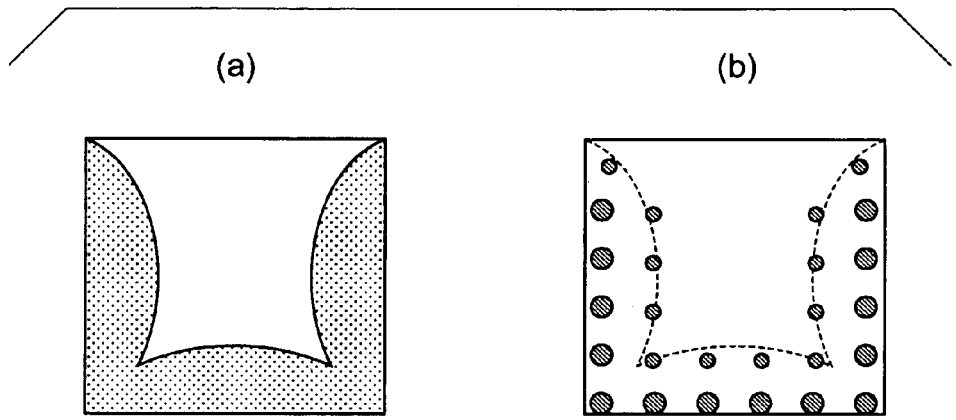
FIG. 5 is a view showing a distribution of a vaporization amount and a distribution of an applied amount for compensating vaporization.

FIG. 5(*a*) shows an example of a distribution of a vaporization amount of the imprint member on the substrate. It is assumed that the vaporization amount is large at the ends of three directions, the left, right and bottom, and the vaporization amount becomes smaller toward the center. In the case of such a distribution of the vaporization amount, a distribution of an applied amount of the imprint member for compensating vaporization is a distribution as shown in FIG. 5(*b*). Namely, the vaporization amount is large at the ends of three directions, the left, right and bottom, and becomes smaller toward the center.

The vaporization amount of the imprint member may vary depending upon a current of a gas for adjusting a temperature and humidity during the imprint process. When the vaporization amount in the upper region of the substrate surface decreases under the influence of the current of the gas, as shown in FIG. 5(b), the distribution of an applied amount for compensating vaporization in the upper region of the substrate surface is set smaller than the applied amount in the other regions.

A plurality of such distributions of applied amounts for compensating vaporization are stored in the vaporization-to-be-compensated storing section 22 in accordance with pattern densities of the template, and the arithmetic section 10 calculates a pattern density from the template information, and extracts a corresponding distribution of an applied amount for compensating vaporization from the vaporization-to-be-compensated storing section 22.

Here, the pattern density refers to a ratio of a concave section in a concave-convex pattern within an arbitrary region of the template. In the present embodiment, the distribution of an applied amount for compensating vaporization which is to be applied on the substrate is decided in accordance with a pattern density of the whole of the template shown in FIG. 3.

The arithmetic section 10 adds up the distribution of an applied amount for filling a pattern, the distribution of an applied amount for forming a remaining film thickness, and the distribution of an applied amount for compensating vaporization, to obtain a distribution of an applied amount of the imprint member, and then stores the obtained distribution into the applied amount distribution storing section 23.

Figure 6:
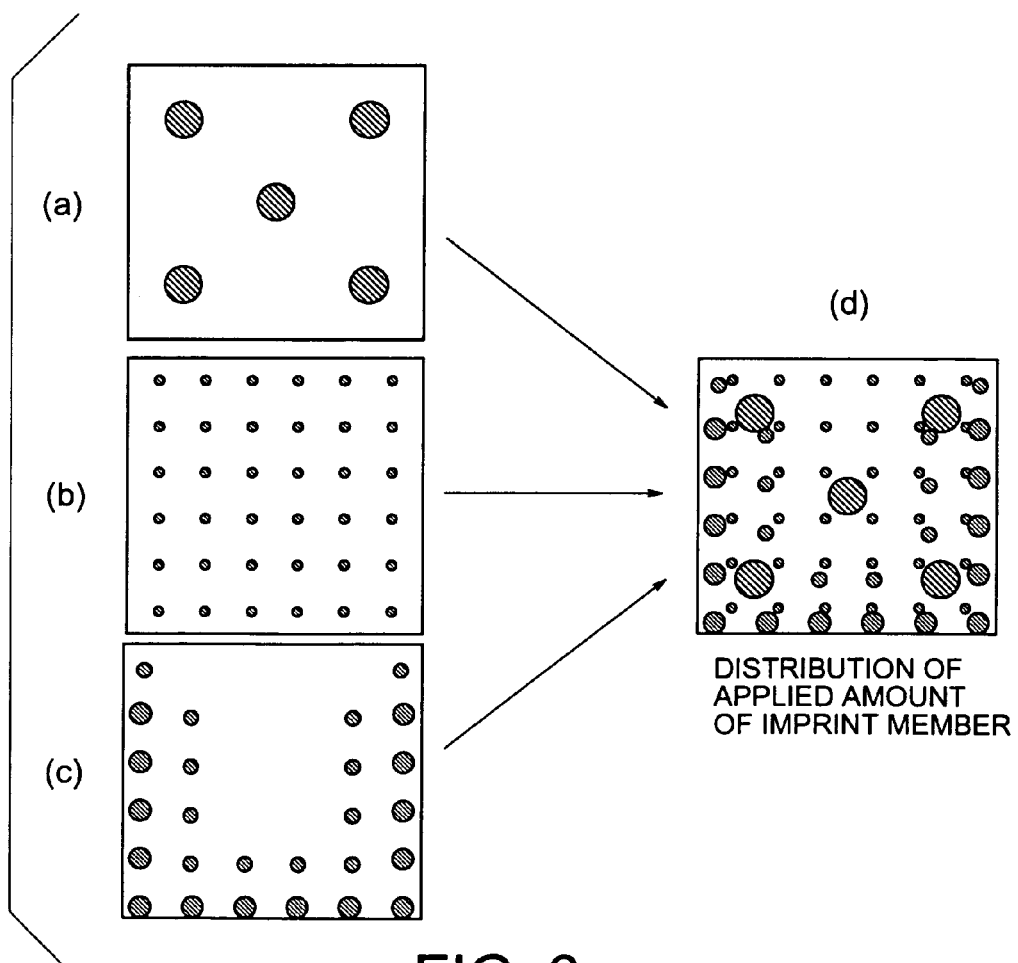
FIG. 6 is a view showing a method for calculating a distribution of an applied amount of an imprint member.

For example, the distribution of an applied amount for filling a pattern shown in FIG. 6(a) (the same as FIG. 4(a)), the distribution of an applied amount for forming a remaining film thickness shown in FIG. 6(b) (the same as FIG. 4(b)), and the distribution of an applied amount for compensating vaporization shown in FIG. 6(c) (the same as FIG. 5(b)) are added up, thereby to obtain the distribution of an applied amount of the imprint member as shown in FIG. 6(d).

Figure 7:
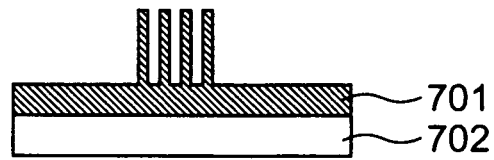
FIG. 7 is a view showing a vertical sectional view of a formed pattern.

The imprint member based upon this distribution of an applied amount of the imprint member is applied and the processes as shown in FIGS. 2(a) to 2(d) are performed, to form on a substrate 702 a pattern 701 which is uniform in remaining film thickness and highly precise in shape, as shown in FIG. 7. FIG. 7 is a vertical sectional view of a pattern formed by the portion of the template T1 corresponding to FIG. 3(c).

Subsequently described is a method for calculating a distribution of an applied amount of the imprint member in the case of using a template T2 different in pattern density from the template T1 shown in FIG. 3.

FIG. 8(a) shows a bottom view of a state where a concave-convex pattern of the template T2 used here is turned downward. As in the case of the template T1 shown in FIG. 3, concave-convex patterns P1 to P5 are formed in four corners and the center within the template T2. Further, in a region other than those patterns, a pattern with a larger pitch (line/space) than those of the concave-convex patterns P1 to P5 is formed.

FIG. 8(b) is a vertical sectional view of the template T2 along a line D-D' of FIG. 8(a), and FIG. 8(c) is a vertical sectional view of the template T2 along a line E-E' of FIG. 8(a).

Figure 9:
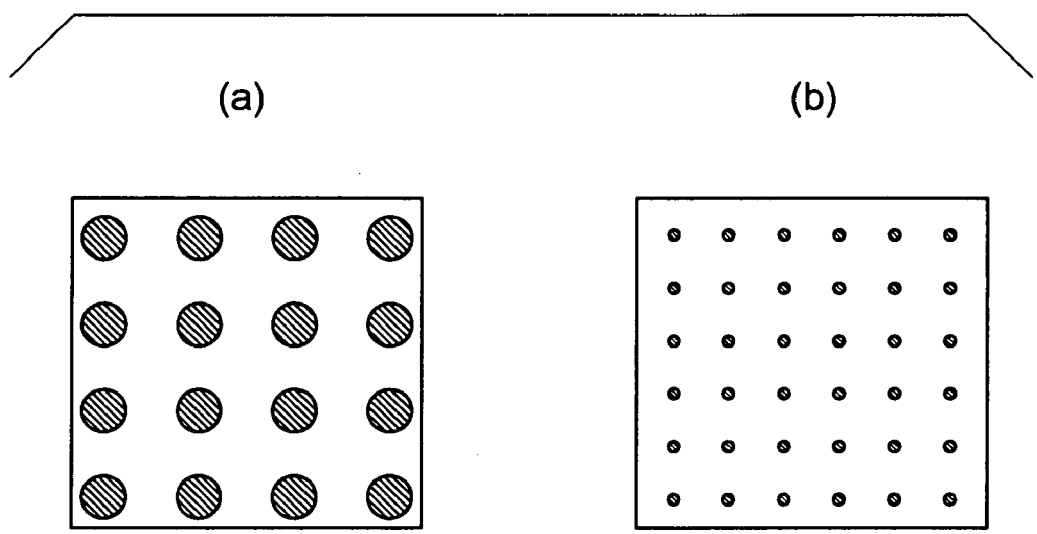
FIG. 9 is a view showing a distribution of an applied amount for filling a pattern and a distribution of an applied amount for forming a remaining film thickness.

A distribution of an applied amount for filling a pattern on a substrate where patterns are formed by the template T2 as thus described is a distribution as shown in FIG. 9(a). Namely, the imprint member in amount to fill the concave-convex patterns of the template T2 is applied on the regions corresponding to those concave-convex patterns.

FIG. 9(b) shows a distribution of an applied amount for forming a remaining film thickness. In the same manner as shown in FIG. 4(b), the imprint member to form the remaining film thickness is uniformly formed on the substrate.

Figure 10:
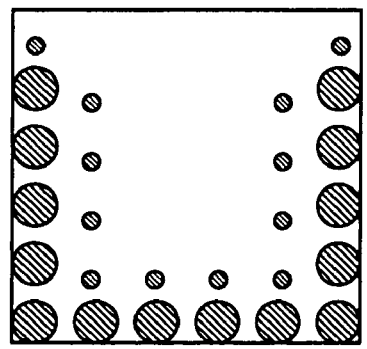
FIG. 10 is a view showing a distribution of an applied amount for compensating vaporization.

FIG. 10 shows a distribution of a vaporization amount of the imprint member on the substrate. A distribution of an applied amount for compensating vaporization to be applied on the substrate is decided in accordance with a pattern density of the whole of the template shown in FIG. 8. It is assumed that, as the distribution shown in FIG. 5(a), the vaporization amount is large at the ends of three directions, the left, right and bottom, and the vaporization amount becomes smaller toward the center. As shown in FIG. 10, the imprint member to compensate vaporization is large at the ends of three directions, the left, right and bottom, and becomes smaller toward the center. As described above, this occurs under the influence of a decrease in vaporization amount due to a current of gas for adjusting a temperature and humidity, or the like.

Since the pattern density differs between the template T1 and the template T2, the vaporization amount also differs therebetween. Therefore, the applied amount to compensate vaporization differs from that shown in FIG. 5(b).

Figure 11:
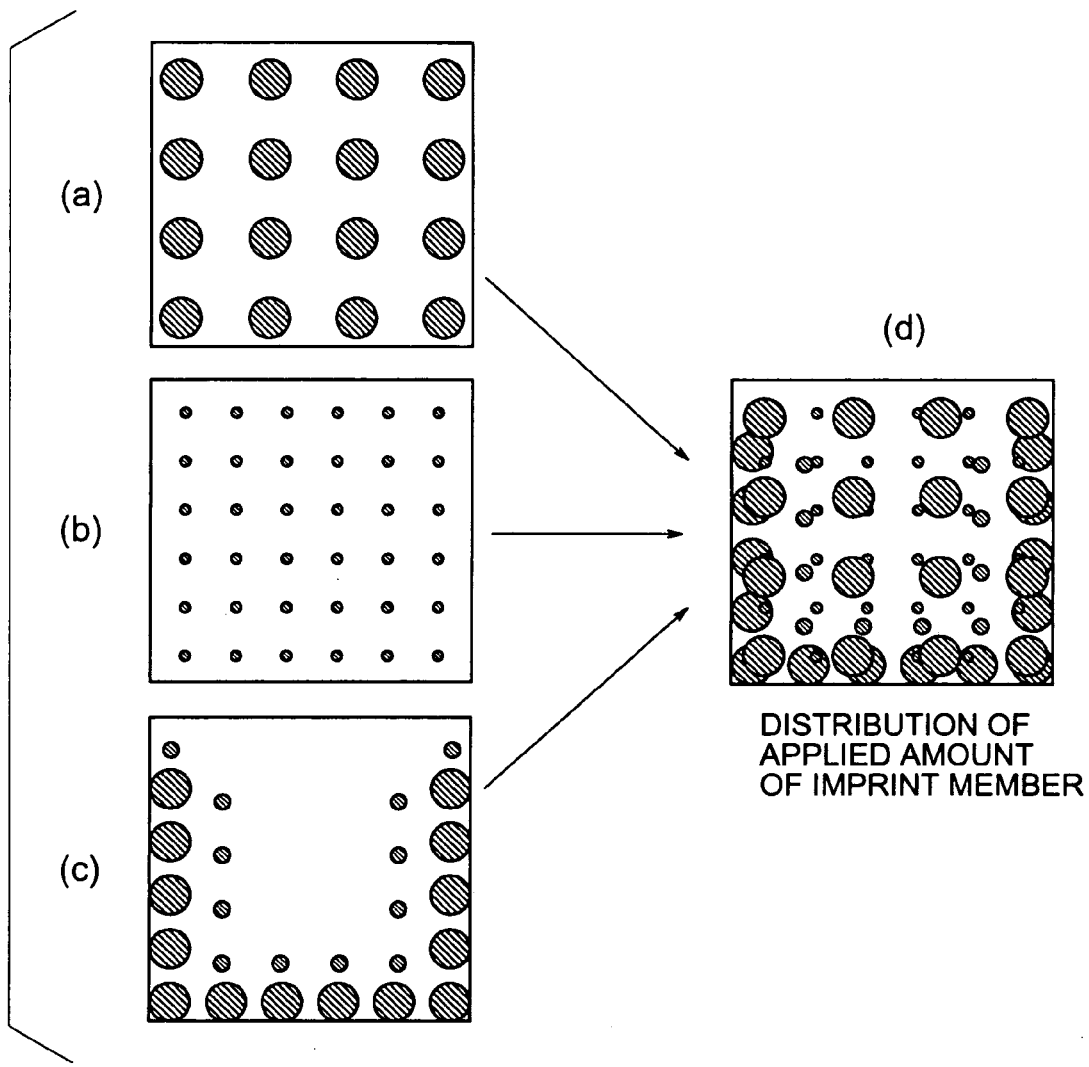
FIG. 11 is a view showing a method for calculating a distribution of an applied amount of the imprint member.

A distribution of an applied amount of the imprint member is a distribution as shown in FIG. 11(d) which is obtained by adding up the distribution of an applied amount for filling a pattern shown in FIG. 11(a) (the same as FIG. 9(a)), the distribution of an applied amount for forming a remaining film thickness shown in FIG. 11(b) (the same as FIG. 9(b)), and the distribution of an applied amount for compensating vaporization shown in FIG. 11(c) (the same as FIG. 10).

Figure 12:
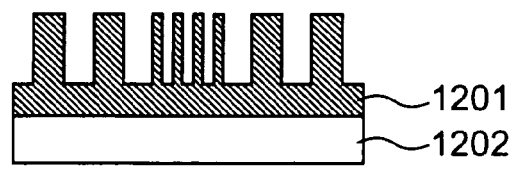
FIG. 12 is a view showing a vertical sectional view of a formed pattern.

The imprint member based upon this distribution of an applied amount of the imprint member is applied and the processes as shown in FIGS. 2(a) to 2(d) are performed, to form on a substrate 1202 a pattern 1201 which is uniform in remaining film thickness and highly precise in shape, as shown in FIG. 12. FIG. 12 is a vertical sectional view of a pattern formed by the portion of the template T2 corresponding to FIG. 8(c).

A distribution of an applied amount for compensating vaporization is selected from the plurality of distributions of applied amounts for compensating vaporization based upon the pattern density of the template. The selected distribution is then added with the distribution of an applied amount for filling a pattern and the distribution of an applied amount for forming a remaining film thickness, to calculate a distribution of an applied amount of the imprint member. Since the imprint member is applied based upon this distribution of an applied amount of the imprint member, to perform pattern formation, it is possible to form a pattern uniform in remaining film thickness and highly precise in shape.

COMPARATIVE EXAMPLE

Figure 8:
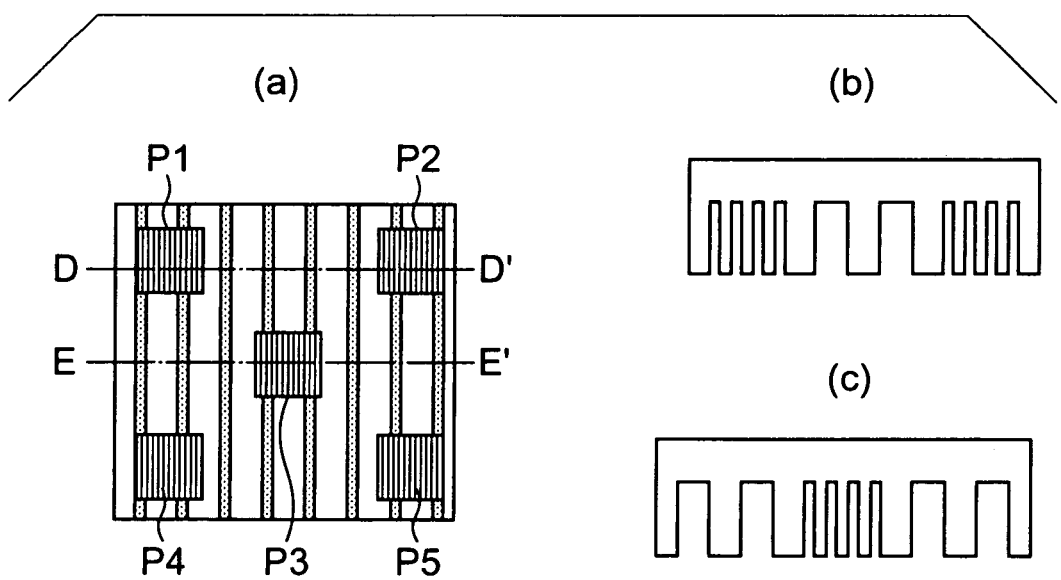
FIG. 8 is a view showing a schematic configuration of a template.

An imprint method according to a comparative example is described. It is only one kind of distribution of an applied amount for compensating vaporization that is used in the imprint method according to the comparative example. Therefore, the distribution of an applied amount for compensating vaporization to be added up in calculation of the distribution of an applied amount of the imprint member is the same in the case of using the template T1 as shown in FIG. 3 and in the case of using the template T2 as shown in FIG. 8.

Figure 13:
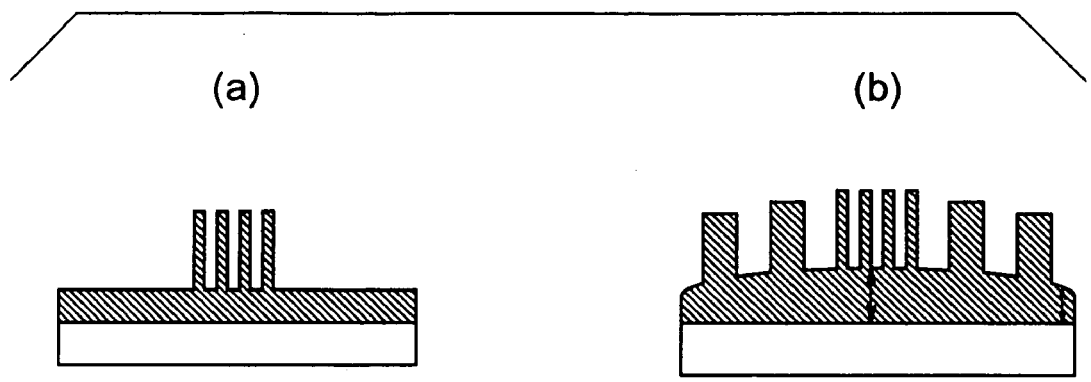
FIG. 13 is a view showing a vertical sectional view of a pattern formed by an imprint method according to a comparative example.

When the imprint member is applied based upon the distribution of an applied amount of the imprint member as thus calculated and the processes shown in FIGS. 2(a) to 2(d) are performed, a pattern as shown in FIG. 13 is formed. FIG. 13(a) is a pattern formed by the template T1, and FIG. 13(b) is a pattern formed by the template T2.

As shown in FIG. 13, the pattern formed by the template T1 is uniform in remaining film thickness and highly precise in shape. On the other hand, the pattern formed by the template T2 is nonuniform in remaining film thickness and poorly precise in shape. When a process treatment such as etching is performed using the patterns as thus described, the abnormality in processed shape occurs.

The remaining film thickness becomes nonuniform as thus described because an actual vaporization amount that varies depending upon the pattern density cannot be compensated by only one kind of distribution of an applied amount for compensating vaporization.

As opposed to this, the imprint system according to the above embodiment has a plurality of distributions of applied amounts for compensating vaporization, and uses a distribution of an applied amount for compensating vaporization according to the pattern density of the template, so as to compensate the actual vaporization amount of the imprint member.

It is therefore possible to form a pattern uniform in remaining film thickness and highly precise in shape even when the pattern densities of the template to be used vary.

First Modified Example

When the pattern density of the template varies in each region, a distribution of an applied amount for compensating vaporization corresponding to each region may be combined.

Figure 14:
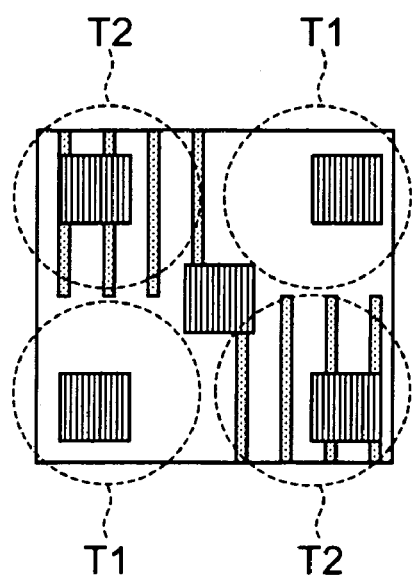
FIG. 14 is a view showing a top surface of a pattern formed according to a first modified example.

A description is given, taking as an example the case of forming a pattern as shown in FIG. 14 such that the concave-convex patterns in accordance with the template T2 are formed in the upper left and the lower right portions and the concave-convex patterns in accordance with the template T1 are formed in the upper right and lower left portions.

Figure 15:
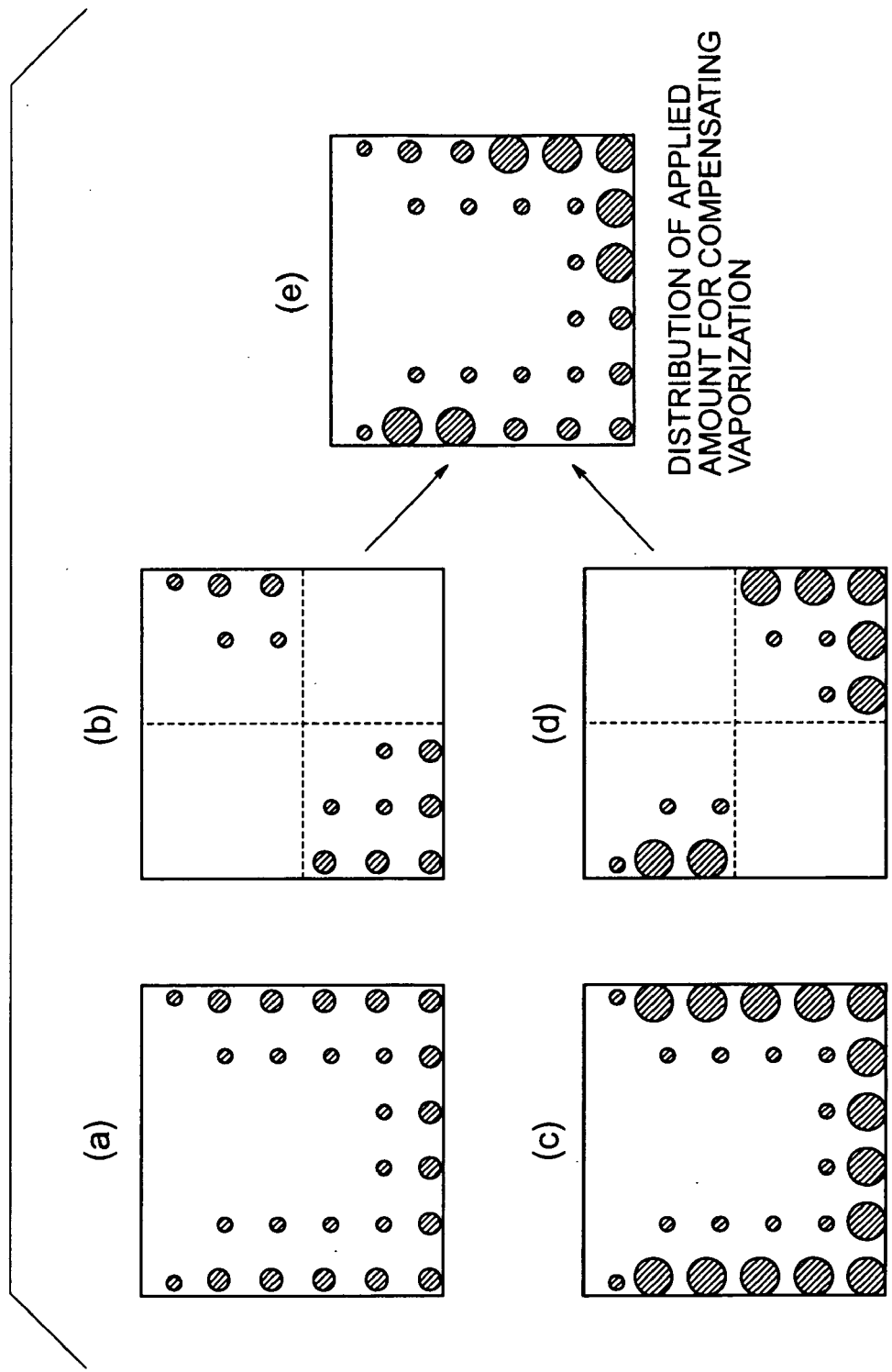
FIG. 15 is a view showing a method for calculating a distribution of an applied amount for compensating vaporization.

The distribution of an applied amount for compensating vaporization in the upper right and lower left portions (FIG. 15(b)) out of the distribution of an applied amount for compensating vaporization of the template T1 shown in FIG. 15(a) is combined with the distribution of an applied amount for compensating vaporization in the upper left and lower right portions (FIG. 15(d)) out of the distribution of an applied amount for compensating vaporization of the template T2 shown in FIG. 15(c), to create a distribution of an applied amount for compensating vaporization as shown in FIG. 15(e).

Figure 16:
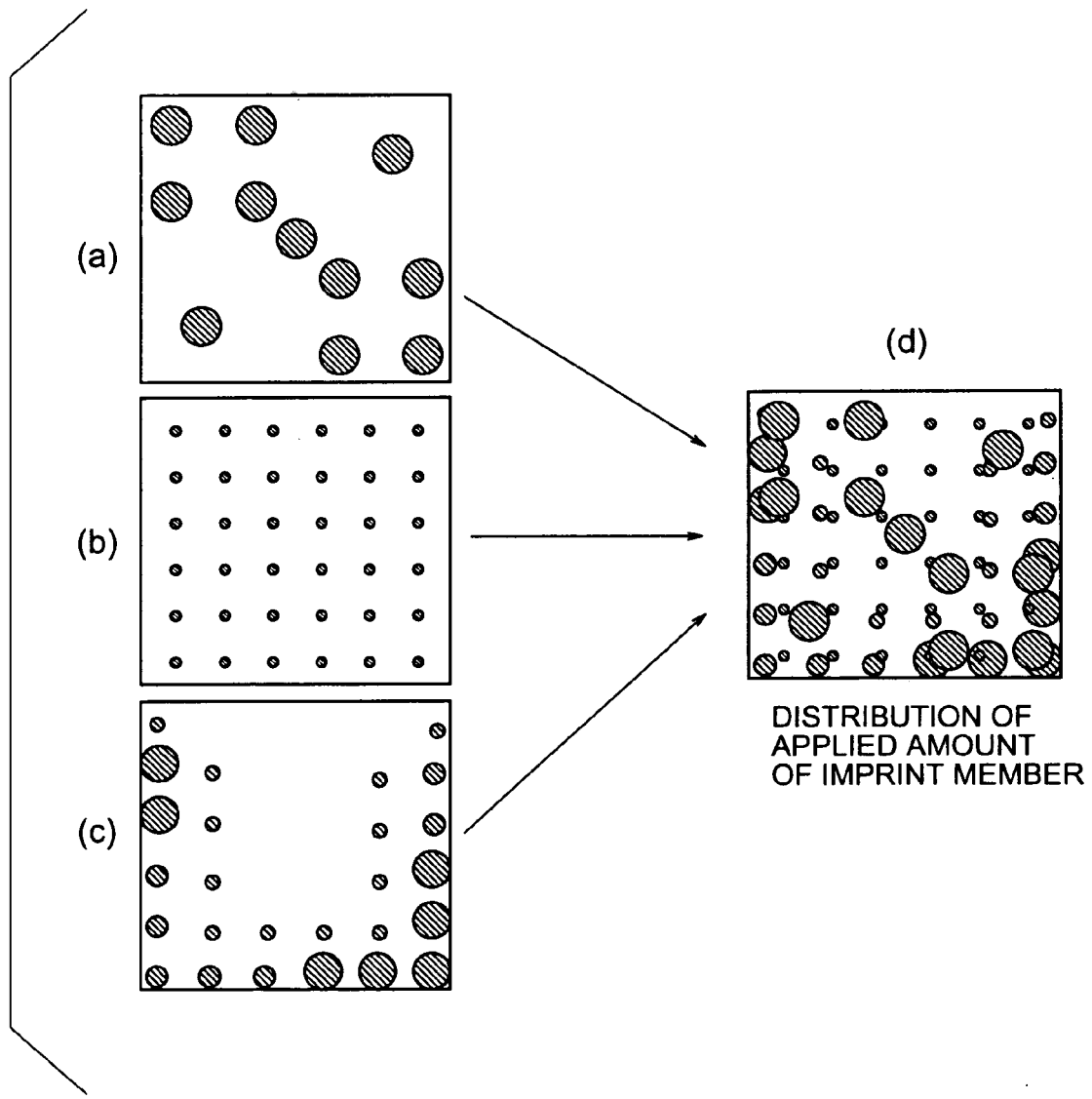
FIG. 16 is a view showing a method for calculating a distribution of an applied amount of the imprint member.

Further, in the same manner as above, a distribution of an applied amount for filling a pattern as shown in FIG. 16(a) is obtained.

The distribution of an applied amount for filling a pattern shown in FIG. 16(a), the distribution of an applied amount for forming a remaining film thickness shown in FIG. 16(b), and the distribution of an applied amount for compensating vaporization shown in FIG. 16(c) (the same as FIG. 15(e)) are added up, to obtain the distribution of an applied amount of the imprint member as shown in FIG. 16(d).

As thus described, even when a pattern density varies in each region within one template, it is possible to obtain an optimum distribution of an applied amount of the imprint member, so as to form a pattern uniform in remaining film thickness and highly precise in shape.

Second Modified Example

Figure 17:
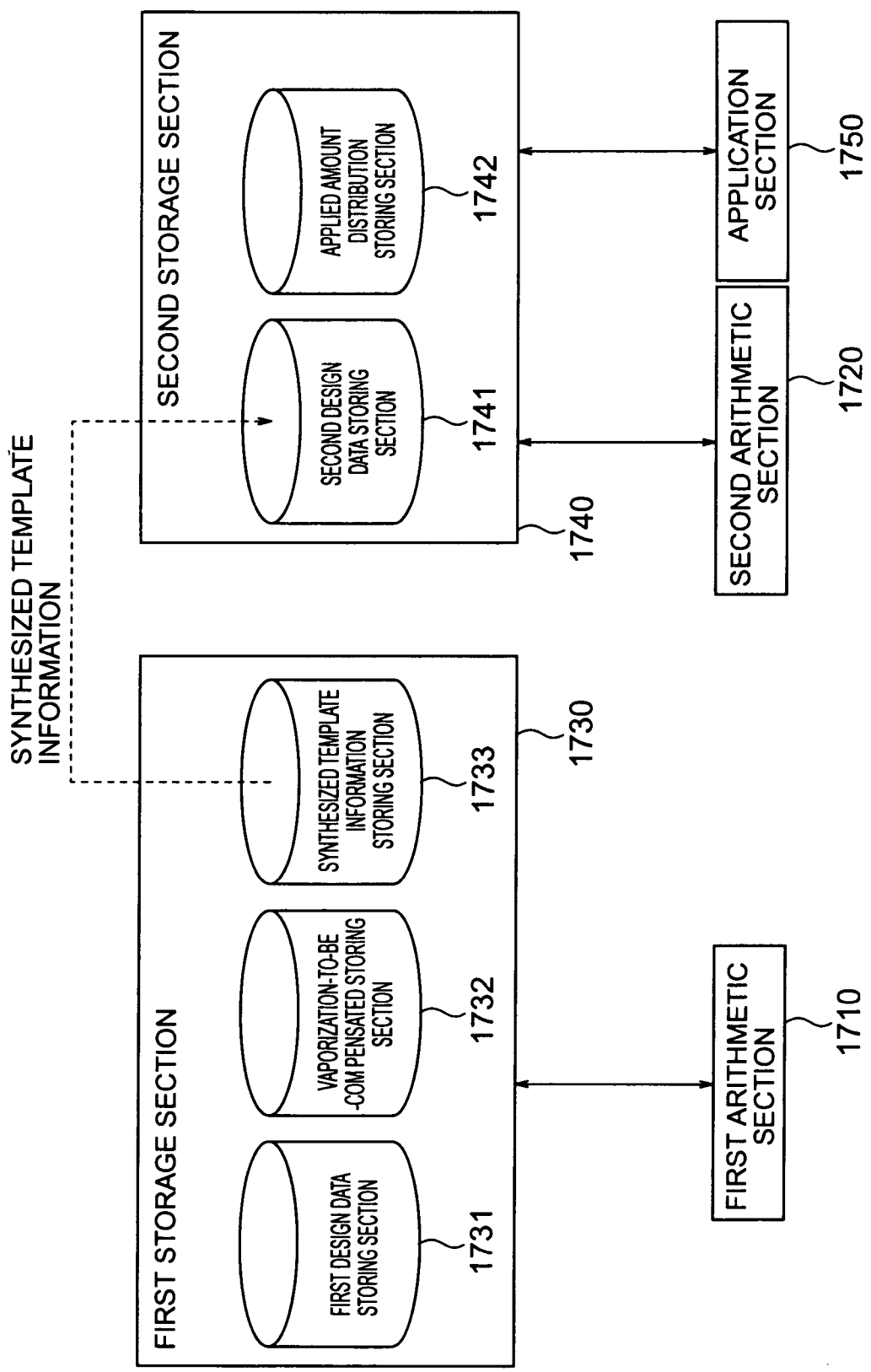
FIG. 17 is a view showing a schematic configuration of an imprint system according to a second modified example.

FIG. 17 shows a schematic configuration of an imprint system according to a second modified example. The imprint system has a first arithmetic section 1710, a second arithmetic section 1720, a first storage section 1730, a second storage section 1740, and an application section 1750.

The first storage section 1730 has a first design data storing section 1731, a vaporization-to-be-compensated storing section 1732, and a synthesized template information storing section 1733. The second storage section 1740 has a second design data storing section 1741 and an applied amount distribution storing section 1742.

The design data storing section 1731 stores template information. The template information is GDS data at the time of producing a template.

The vaporization-to-be-compensated storing section 1732 has a plurality of distributions of applied amounts for compensating vaporization in accordance with pattern densities of the template.

The first arithmetic section 1710 calculates a pattern density based upon the template information stored in the first design data storing section 1731, and extracts a corresponding distribution of an applied amount for compensating vaporization from the vaporization-to-be-compensated storing section 1732.

The first arithmetic section 1710 may calculate a pattern density in each arbitrary region, extract a corresponding distribution of an applied amount for compensating vaporization from the vaporization-to-be-compensated storing section 1732, and combine the extracted distributions.

The first arithmetic section 1710 then creates a template pattern (dummy template pattern) such that the extracted distribution of an applied amount for compensating vaporization becomes a distribution of an applied amount for filling a pattern.

The first arithmetic section 1710 adds up an actual pattern of the template based upon the template information and this dummy template pattern, to create a synthesized template pattern, and stores the created pattern into the synthesized template information storing section 1733.

The second design data storing section 1741 stores synthesized template information including a synthesized template pattern and remaining film thickness set value information.

The second arithmetic section 1720 calculates a distribution of an applied amount for filling a synthesized pattern, an applied amount for filling the synthesized template pattern, based upon the synthesized template information. The synthesized template pattern is a pattern created with an applied amount for compensating vaporization in accordance with the pattern density of the template taken into consideration. Therefore, the distribution of an applied amount for filling a synthesized pattern which is calculated here includes an applied amount for compensating vaporization.

Further, the second arithmetic section 1720 calculates a distribution of an applied amount for forming a remaining film thickness based upon the remaining film thickness setting value information. The second arithmetic section 1720 then adds up the distribution of an applied amount for filling a synthesized pattern and the distribution of an applied amount for forming a remaining film thickness, to calculate a distribution of an applied amount of the imprint member, and stores the calculated distribution into the applied amount distribution storing section 1742.

The application section 1750 applies the imprint member on the substrate based upon the distribution of an applied amount of the imprint member stored into the applied amount distribution storing section 1742.

Since the imprint member to compensate a vaporization amount in accordance with the pattern density of the template is applied, it is possible by the subsequent imprint process to form a pattern uniform in remaining film thickness and highly precise in shape.

Further, performing the processes in the first arithmetic section 1710 and the first storage section 1730, namely creation of the synthesized template pattern, by an off-line data process eliminates the need for providing the vaporization-to-be-compensated storing section within the imprint device having the second arithmetic section 1720, the second storage section 1740, and the application section 1750, thereby allowing reduction in device cost.

What is claimed is:

1. An imprint system, comprising:
   a first design data storing section which stores template information including a position and a depth of a concave-convex pattern of a template;
   a vaporization-to-be-compensated storing section which stores a plurality of distributions of applied amounts for compensating vaporization, each showing an applied position and an applied amount of an imprint member that compensates the imprint member to vaporize, in accordance with pattern densities of said template;
   a first arithmetic section which
   calculates a pattern density of the template from said template information,
   extracts a distribution of an applied amount for compensating vaporization, corresponding to this pattern density, from said vaporization-to-be-compensated storing section,
   calculates a dummy template pattern such that this extracted distribution of an applied amount for compensating vaporization becomes a distribution of an applied amount for filling a pattern, showing an applied position and an applied amount of the imprint member corresponding to the imprint member to fill the concave-convex pattern, and
   synthesizes this dummy template pattern with the concave-convex pattern of said template, to create a synthesized pattern;
   a second design data storing section which stores synthesized pattern information including said synthesized pattern, and remaining film thickness set value information including a film thickness of a remaining film uniformly formed on a substrate;
   a second arithmetic section which
   calculates a distribution of an applied amount for filling the synthesized pattern, showing an applied position and an applied amount of the imprint member corresponding to the imprint member to fill the inside of a concave-convex pattern of said synthesized pattern based upon said synthesized pattern information,
   calculates a distribution of an applied amount for forming a remaining film thickness, showing an applied position and an applied amount of the imprint member corresponding to the imprint member to form the remaining film based upon said remaining film thickness set value information, and
   adds up said distribution of an applied amount for filling a synthesized pattern and said distribution of an applied amount for forming a remaining film thickness, to calculate a distribution of an applied amount of the imprint member; and
   an application section which applies the imprint member on the substrate based upon said distribution of an applied amount of the imprint member.

2. The imprint system according to claim 1, wherein said first arithmetic section calculates said pattern density with respect to each arbitrary region within said template, and extracts a distribution of an applied amount for compensating vaporization, corresponding to said each region, from said vaporization-to-be-compensated storing section.

3. The imprint system according to claim 1, wherein said first arithmetic section calculates a ratio of a concave section of a concave-convex pattern in an arbitrary region of said template as said pattern density.

4. An imprint method, comprising:
   calculating a pattern density of a template from template information including a position and a depth of a concave-convex pattern of said template;
   calculating a dummy template pattern such that a distribution of an applied amount for compensating vaporization becomes a distribution of an applied amount for filling a pattern, showing an applied position and an applied amount of an imprint member that compensates the imprint member to vaporize in accordance with said calculated pattern density and becomes a distribution of an applied amount for filling a pattern, showing an applied position and an applied amount of the imprint member corresponding to the imprint member to fill the concave-convex pattern;
   synthesizing said dummy template pattern with the concave-convex pattern of said template, to create a synthesized pattern;
   calculating a distribution of an applied amount for filling the synthesized pattern, showing an applied position and an applied amount of the imprint member corresponding to the imprint member to fill the inside of a concave-convex pattern of said synthesized pattern;
   calculating a distribution of an applied amount for forming a remaining film thickness, showing an applied position and an applied amount of the imprint member corresponding to the imprint member to form a remaining film that is uniformly formed on a substrate based upon remaining film thickness set value information including a film thickness of the remaining film;
   adding up said distribution of an applied amount for filling a synthesized pattern and said distribution of an applied amount for forming a remaining film thickness, to calculate a distribution of an applied amount of the imprint member; and
   applying the imprint member on the substrate based upon said distribution of an applied amount of the imprint member.

5. The imprint method according to claim 4, wherein a ratio of a concave section of a concave-convex pattern in an arbitrary region of said template is calculated as said pattern density.

* * * * *